US011677329B2

(12) United States Patent
Malapelle et al.

(10) Patent No.: US 11,677,329 B2
(45) Date of Patent: Jun. 13, 2023

(54) CONTROL SYSTEM FOR MEDIUM VOLTAGE VARIABLE FREQUENCY DRIVE (71) Applicant: Siemens Aktiengesellschaft, Munich (DE)

(72) Inventors: Paolo Malapelle, Verona (IT); James A. Buckey, Lower Burrell, PA (US); Shelby Chun, Mt. Lebanon, PA (US); Alan Wright, Sarver, PA (US); Grigoriy Puchkarev, Tarentum, PA (US)

(73) Assignee: Siemens Aktiengesellschaft, Munich (DE)

( * ) Notice: Subject to any disclaimer, the term of this patent is extended or adjusted under 35 U.S.C. 154(b) by 186 days.

(21) Appl. No.: 17/267,836

(22) PCT Filed: Aug. 29, 2018

(86) PCT No.: PCT/US2018/048494
§ 371 (c)(1),
(2) Date: Feb. 11, 2021

(87) PCT Pub. No.: WO2020/046287
PCT Pub. Date: Mar. 5, 2020

(65) Prior Publication Data
US 2021/0313904 A1    Oct. 7, 2021

(51) Int. Cl.
*H02M 7/49* (2007.01)
*H02M 7/483* (2007.01)
(Continued)

(52) U.S. Cl.
CPC ........... *H02M 7/49* (2013.01); *H02M 1/0012* (2021.05); *H02M 7/003* (2013.01);
(Continued)

(58) Field of Classification Search
CPC ... H02M 7/49; H02M 7/4835; H02M 7/53873
See application file for complete search history.

(56) References Cited

U.S. PATENT DOCUMENTS 9,559,541 B2 *  1/2017  Cheng ..................... H02M 1/36
2003/0107398 A1 *  6/2003  Bailis .................. G06F 15/7867
326/38
(Continued)

FOREIGN PATENT DOCUMENTS

EP          2193599 A1      6/2010

OTHER PUBLICATIONS

PCT International Search Report and Written Opinion of International Searching Authority dated May 31, 2019 corresponding to PCT International Application No. PCT/US2018/048494 filed Aug. 29, 2018.
(Continued)

*Primary Examiner* — Gary A Nash (57) ABSTRACT

A drive system (300) includes a plurality of power cells (312) supplying power to one or more output phases (A, B, C), each power cell (312) having multiple switching devices (315a-d) incorporating semiconductor switches, and a control system (400) in communication with the plurality of power cells (312) and controlling operation of the plurality of power cells (312), wherein the control system (400) includes a system on chip (410) with one or more central processing units (412, 414) and a field programmable gate array (416) in communication with the one or more central processing units (412, 414).

13 Claims, 5 Drawing Sheets (51) Int. Cl.
  *H02M 7/5387* (2007.01)
  *H02M 1/00* (2006.01)
  *H02M 7/00* (2006.01)
  *H03K 19/17704* (2020.01)

(52) U.S. Cl.
  CPC .... *H02M 7/4835* (2021.05); *H03K 19/17712* (2013.01); *H02M 7/53873* (2013.01)

(56) References Cited

U.S. PATENT DOCUMENTS

| | | | | |
|---|---|---|---|---|
| 2003/0231517 | A1* | 12/2003 | Bixel | H02M 5/4585 363/71 |
| 2014/0078797 | A1* | 3/2014 | Mihalache | H02M 7/4835 363/71 |
| 2015/0263645 | A1* | 9/2015 | Mihalache | H02M 7/537 318/504 |
| 2017/0110977 | A1* | 4/2017 | Mihalache | H02M 7/501 |
| 2017/0229976 | A1* | 8/2017 | Jiang-Häfner | H02M 1/32 |

OTHER PUBLICATIONS

Schwendemann Rudiger et al: "A Modular Converter and Signal Processing Platform for Academic Research in the Field of Power Electronics", 2018 International Power Electronics Conference, May 20, 2018, pp. 3074-3080.

Lopez Mario et al: "Design and implementation of the control of an MMC-based solid state transformer", 2015 IEEE 13th International Conference on Industrial Informatics, Jul. 22, 2015, pp. 1583-1590.

Mouser Inc., "Introducing an MCU Guy to FPGA: Part 1", Nov. 6, 2017, URL: https://www.mouser.com/blog/blog/blog/blog/introducing-an-mcu-guy-to-fpga-part-1, figures 1,2.

* cited by examiner

CONTROL SYSTEM FOR MEDIUM VOLTAGE VARIABLE FREQUENCY DRIVE

BACKGROUND

1. Field

Aspects of the present disclosure generally relate to a control system for a drive system, specifically a medium voltage variable frequency drive. Throughout the specification, the terms "drive", "drive system", "converter" and "power supply" can be used interchangeably.

2. Description of the Related Art

Medium voltage (MV) variable frequency drives, such as for example multilevel power converters, are used in applications of medium voltage alternating current (AC) drives, flexible AC transmission systems (FACTS), and High Voltage DC (HVDC) transmission systems, because single power semiconductor devices cannot handle high voltage. Multilevel power converters typically include a plurality of power cells for each phase, each power cell including an inverter circuit having semiconductor switches that are capable of altering the voltage output of the individual cells.

One example of a multilevel power converter is a cascaded H-bridge converter system having a plurality of H-bridge cells as described for example in U.S. Pat. No. 5,625,545 to Hammond, the content of which is herein incorporated by reference in its entirety. Another example of a multilevel power converter is a modular multilevel converter system having a plurality of M2C or M2LC subsystems.

Medium voltage drives contain a purpose specific digital control system. Currently, the digital control system splits the tasks of control loop command and status, power cell control information and external communications interface into three separate components. The three separate main components are a control processor/host central processing unit for control loop commands, status and non-drive interfaces, a field programmable gate array (FPGA) for power cell control and communications, and an electronically programmable logic device (EPLD) for external communication. The main components require a dedicated data bus on a printed circuit board (PCB) so that the main components can exchange information between them for a successful operation of the drive system.

However, the current control system architecture requires a considerable amount of physical space used for the PCB data bus trace layout and the three separate components themselves and requires carefully engineered PCB traces for data communications to function properly/consistently. Further, using three separate devices increases probability of an overall system failure due to a manufacturing defect or general usage.

SUMMARY

Briefly described, aspects of the present disclosure relate to a drive system, embodied for example as a medium voltage variable frequency drive, and more specifically to a control system for the drive system. Specifically, an aspect of the present disclosure provides a drive system comprising a plurality of power cells supplying power to one or more output phases, each power cell comprising multiple switching devices incorporating semiconductor switches, and a control system in communication with the plurality of power cells and controlling operation of the plurality of power cells, wherein the control system comprises a system on chip comprising one or more central processing units and a field programmable gate array in communication with the one or more central processing units.

DETAILED DESCRIPTION

To facilitate an understanding of embodiments, principles, and features of the present invention, they are explained hereinafter with reference to implementation in illustrative embodiments. In particular, they are described in the context of being a control system for a variable frequency drive, in particular medium voltage (MV) variable frequency drives including multi-cell power supplies such as modular multilevel converter systems and cascaded H-bridge converter systems. Embodiments of the present invention, however, are not limited to use in the described devices or methods.

As used herein, a "medium voltage" is a voltage of greater than about 690V and less than about 69 KV, and a "low voltage" is a voltage less than about 690V. Persons of ordinary skill in the art will understand that other voltage levels may be specified as "medium voltage" and "low voltage". For example, in some embodiments, a "medium voltage" may be a voltage between about 3 kV and about 69 kV, and a "low voltage" may be a voltage less than about 3 kV.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
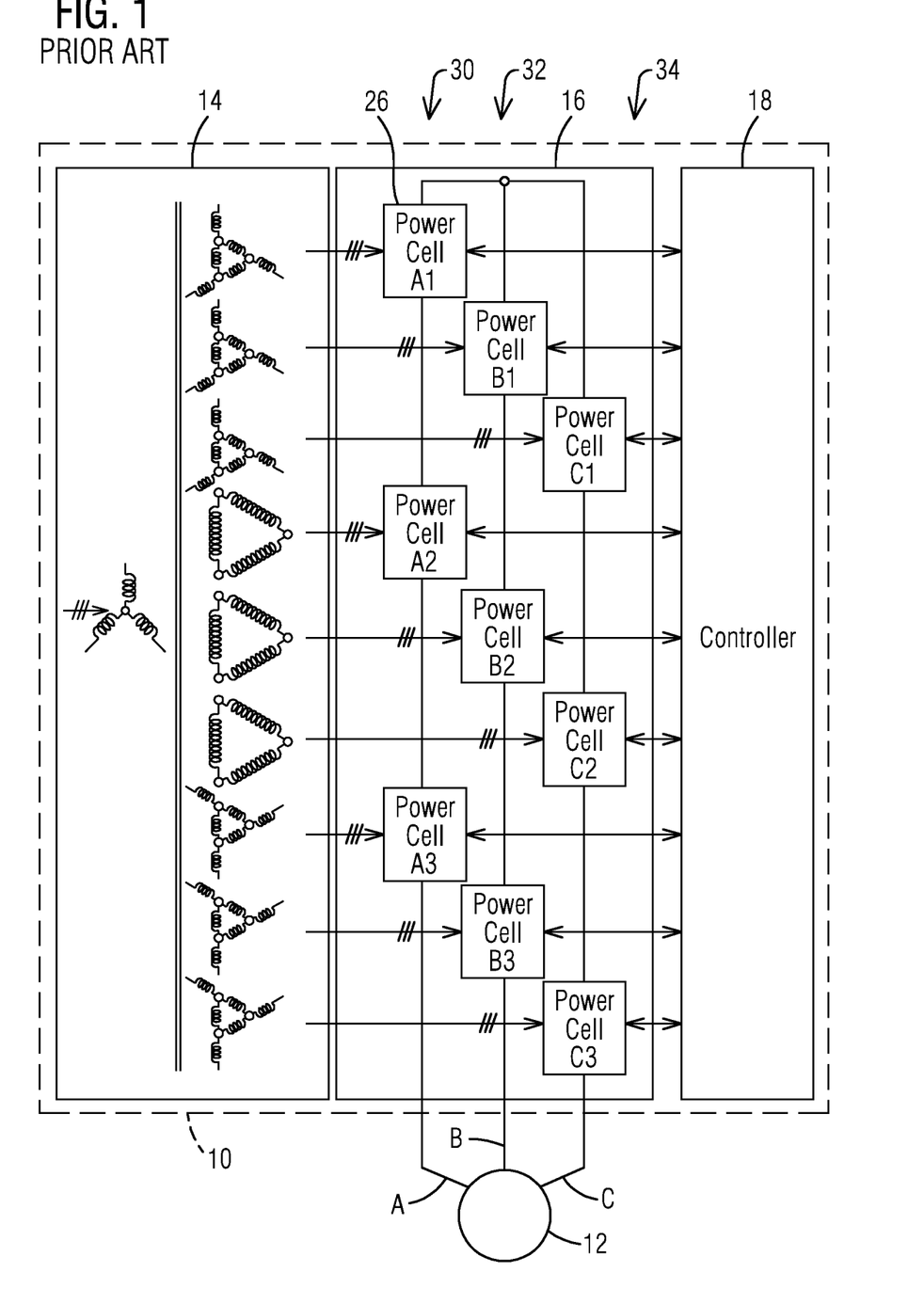
FIG. 1 illustrates a schematic diagram of a known basic configuration of a cascaded H-bridge converter system in accordance with an exemplary embodiment disclosed herein.
Figure 2:
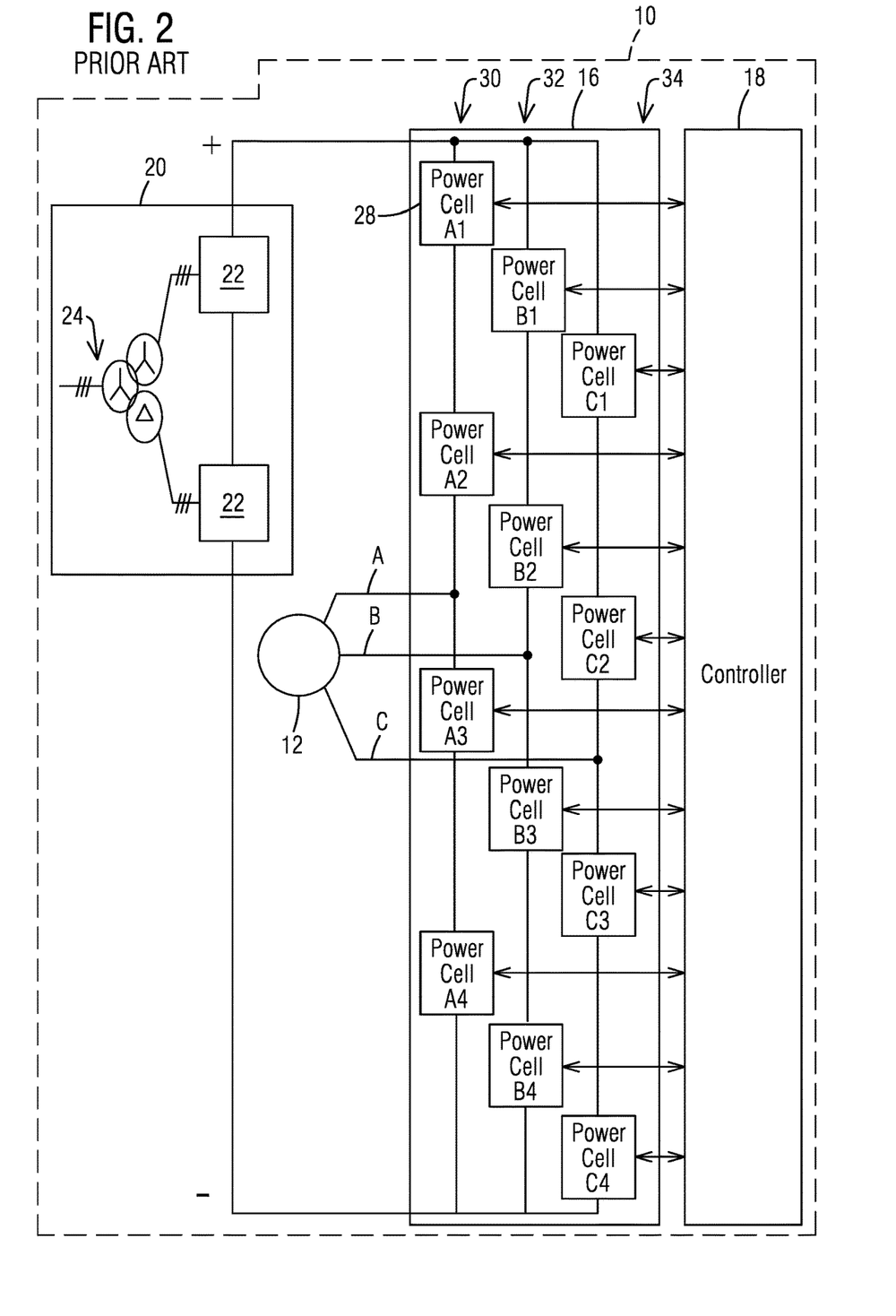
FIG. 2 illustrates a schematic diagram of another known basic configuration of a cascaded H-bridge converter system in accordance with an exemplary embodiment disclosed herein.

FIG. 1 and FIG. 2 each illustrate a schematic of a known multi-cell power supply 10, specifically a cascaded H-bridge converter system that receives three-phase power from an alternating current (AC) source, and delivers power to a load 12, e.g., a three-phase AC motor.

With reference to FIG. 1, the multi-cell power supply 10 includes a transformer 14, a power circuit 16, and a controller 18, herein also referred to as control system. The transformer 14 includes a primary winding that excites nine secondary windings, and power circuit 16 includes multiple printed circuit board (PCB) power cells 26, herein simply referred to as power cells 26, that are operably coupled to the secondary windings, respectively, of the transformer 14. As the power supply 10 comprises nine secondary windings, and a power cell 26 is operably coupled to each secondary winding, the power supply 10 comprises nine power cells 26. Of course, the power supply 10 can comprise more or less than nine power cells 26 and/or more or less than nine secondary windings depending on a type of the power supply 10 and/or a type of the load 12 coupled to the power supply 10.

The power cells 26 can be rated for lower voltages and are configured to provide a medium voltage output to the load 12. Each output phase A, B, C of the power circuit 16 is fed by a group of series-connected power cells 26. Outputs of the power cells 26 are coupled in series in a first phase group 30, at second phase group 32, and a third phase group 34. Each phase output voltage is a sum of the output voltages of the power cells 26 in the respective phase group 30, 32 and 34. For example, the first phase group 30 comprises power cells 26 labelled A1, A2 and A3, wherein the phase output voltage of the output phase A is the sum of the output voltages of the power cells A1, A2 and A3. The same applies to output phase B and power cells B1, B2, B3, and output phase C and power cells C1, C2, C3. In this regard, the power circuit 16 delivers a medium voltage output to load 12 using lower voltage rated power cells 26 that include components rated to lower voltage standards. Each power cell 26 is coupled, e.g., for example via an optical fiber communication link, to controller 18, which may use current feedback and voltage feedback to control operation of the power cells 26.

As illustrated in FIG. 2, a multi-cell power supply 10 includes three-phase AC power supply 20, a power circuit 16, and a controller 18. The three-phase AC power supply 20 includes two diode bridges 22 which are each connected on the AC voltage side to secondary windings of a power converter transformer 24 and are electrically connected in series on a direct current (DC) voltage side. A positive and a negative DC voltage bus are provided for the parallel connection of these phase groups. The power circuit 16 includes power cells 28 that are coupled to the DC voltage bus created by the power supply 20. The power cells 28 are for example lower voltage rated and are configured to provide medium voltage output to load 12. Although the load 12 may be illustrated as being within the multi-cell power supply 10, the load 12 is not part of the multi-cell power supply 10. Rather, the load 12 is separate from, and connected to, the multi-cell power supply 10, as more clearly shown in FIG. 1.

Each output phase A, B, C of the power circuit 16 is fed by a group of series-connected power cells 28, also labelled A1-A4, B1-B4 and C1-C4 with reference to the output phases A, B, C. The power cells 28 are coupled in series in a first phase group 30, a second phase group 32, and a third phase group 34. Each phase output voltage is a sum of the output voltages of the power cells 28 in the phase group 30, 32 and 34 as described before with reference to FIG. 1. The power circuit 16 delivers a medium voltage output to the load 12 using lower voltage rated power cells 28 that include components rated to lower voltage standards. Each power cell 28 is coupled, e.g., for example via optical fiber communication link(s), to the controller 18, which can use current feedback and voltage feedback to control operation of the power cells 28.

It should be noted that in FIG. 1 and FIG. 2 the number of power cells 26, 28 in each phase group 30, 32, 34 can be between 2 and 12 to provide different medium voltage outputs as required by the load 12. As noted before, in the embodiment of FIG. 1, the number of secondary windings of transformer 14 matches the number of power cells 26. In the embodiment of FIG. 2, a number of diode bridges and transformer secondary windings can vary from 1 to 6 to allow for harmonic cancellation on the primary side of the transformer 24. It will be appreciated by those of ordinary skill in the art that other cell counts, and diode bridge counts may be used depending upon the application and that the configurations shown and described herein are intended to be exemplary in natures.

Figure 3:
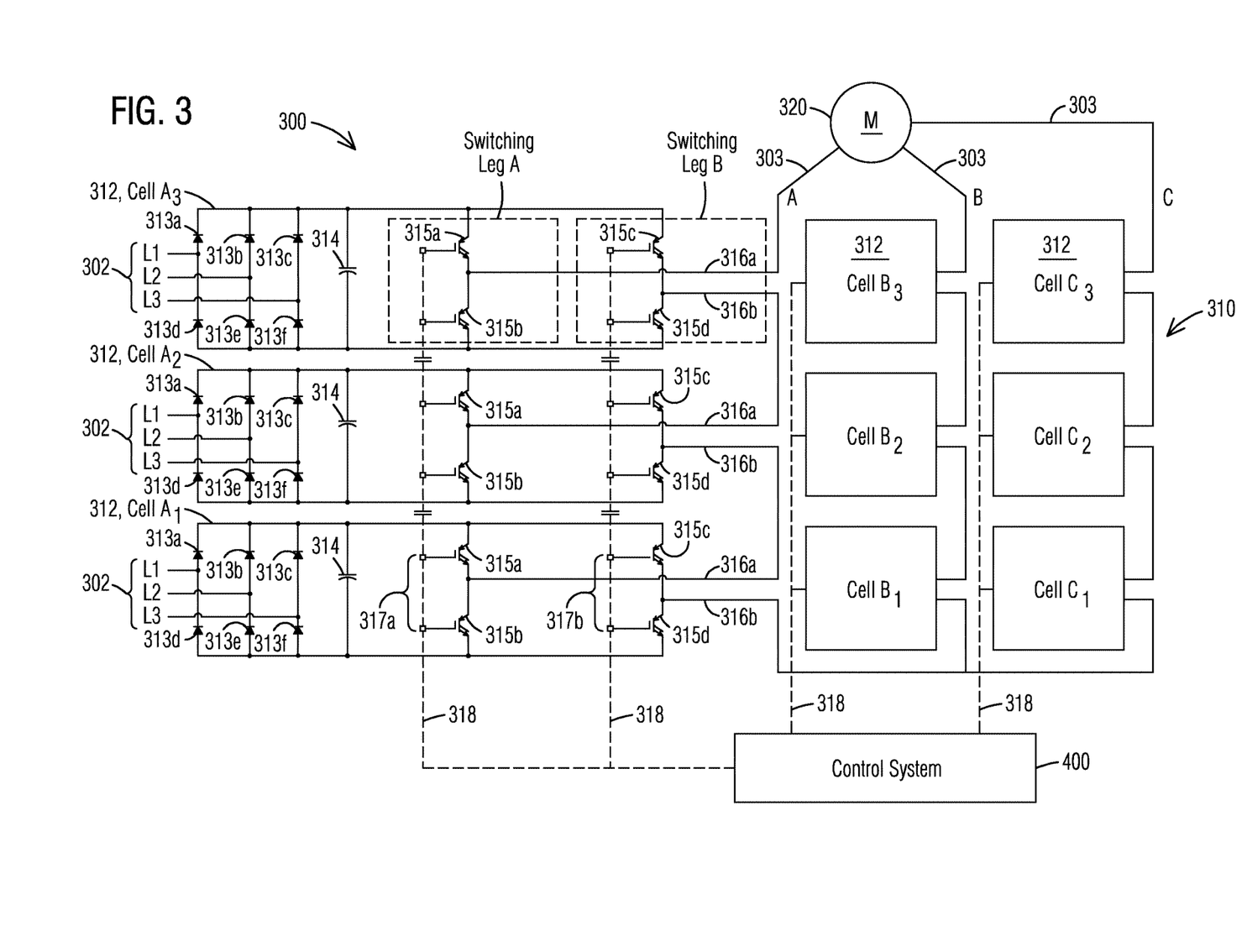
FIG. 3 illustrates a schematic diagram of a drive system in accordance with an exemplary embodiment disclosed herein.

FIG. 3 illustrates a schematic diagram of a drive system 300 comprising cascaded H-bridge multilevel converter 310 having a seven-level topology, including three phases with three power cells per phase, which additionally incorporates a control system 400 in accordance with an aspect of the present disclosure. An example of a cascaded H-bridge multilevel converter 310 is the Perfect Harmony GH180® drive manufactured by Siemens Industry, Inc.

In the example of FIG. 3, the system 300 is a medium voltage drive comprising a three-phase power source providing a power input 302 via lines L1, L2 and L3. The multilevel converter 310 is connected to the AC power input 302 and produces a three-phase AC power supply as output 303, via output phases A, B and C. The AC output 303 can be connected to a load 320, which in this example comprises an electric motor. The motor 320 may be operated by controlling the frequency and/or amplitude of the output voltage produced by the multilevel converter 310.

Each phase of the multilevel converter 310 comprises a respective phase leg formed from a plurality of power cells 312 arranged in a cascaded manner. In the example of FIG. 1, phase legs Leg A, Leg B are each formed from the same number of power cells 312, namely three, that are connected in series. Each power cell 312 of a phase is connected to the power input 302 via respective input lines L1, L2 and L3. Power to the input lines L1, L2, L3 may be provided, for example, via a multi-phase winding transformer.

The power cells 312 of the three phases are respectively labelled as cell $A_1$ through cell $A_3$, cell $B_1$ through cell $B_3$ and cell $C_1$ through cell $C_3$. Each power cell 312 is responsive to control signals from the control system 400, which include for example pulse width modulation (PWM) signals to alter voltage level and/or frequency output, resulting in a multilevel voltage waveform for each phase. The power cells 312 generally include power semiconductor switching devices, passive components (inductors, capacitors), control circuits, processors, interfaces, and other components for communicating with the control system 400, i.e. the power cells 312 operate based on signals from the control system 400.

Each of the power cells 312 include single-phase inverter circuitry connected to separate direct current (DC) sources produced by a rectification of the AC power input for each power cell 312 via input lines L1, L2, L3. In this example, the rectification is carried out by diode rectifiers 313*a-f* arranged in a bridge rectifier configuration. The present example also uses filtering circuitry including, for example, a capacitor 314, for smoothing out voltage ripples from the rectified DC power.

The inverter circuitry of each cell 312 comprises power semiconductor switching devices 315*a-d* arranged in an H-bridge, also referred to as full bridge, configuration. The switching devices 315*a-d* may include, for example and without limitation, power transistors such as insulated-gate bipolar transistors (IGBT). The switching devices 315*a*, 15*b* connect to cell output line 316*a* while the switching devices 315*c*, 315*d* connect to cell output line 316*b*. The transistors 315a-d receive pulse width modulation signals, for example, in the form of gate input signals 318 controlled by the control system 400 based on pulse width modulation. The control system 400 selects either of transistors 315a or 315b to be ON via a first switching leg 317a, and either of transistors 315c or 315d to be ON via a second switching leg 317b, which will permit power to pass to the load 320 by way of the line 316a or 316b respectively. In other words, a controller triggered switching event of the switching leg 317a causes one of the transistors 315a, 315b to be in an ON state and the other to be in OFF state. Likewise, a controller triggered switching event of the switching leg 317b causes one of the transistors 315c, 315d to be in an ON state and the other to be in OFF state. In the embodiments illustrated, the switching legs 317a, 317b of an individual cell 312 are simply referred to as switching leg A and switching leg B of that individual cell 312.

Each of the power cells 312 may be constructed internally to low-voltage standards, despite its inclusion in a medium-voltage apparatus drive 300. By way of example, each power cell 312 may have a 600-volts rating. Thus, the maximum voltage level that can be output by each of the power cells 312 is about 600 VDC. Depending on which transistors are ON, the output voltage across the cell output lines 316a, 316b of each power cell 312 may be of either polarity or zero. Thus, each power cell 312 can have three output states: +600 VDC, −600 VDC, or ZERO VDC. Due to the serial connection between three power cells 312 in each phase output line, such as, for example, cells $A_1, A_2, A_3$ to the output phase A, it is possible to produce a maximum output voltage magnitude of about 1800 VDC for the respective phase output line. Each power cell 312 may be operated independently of another. Therefore, it is possible to provide at least seven voltage levels per phase to motor 320. The approximate values of these line-neutral voltage states include +/−1800 VDC, +/−1200 VDC, +/−600 VDC and ZERO VDC.

The electric motor 320 may comprise any type AC-type motor, for example, synchronous, asynchronous, permanent magnet, and may be rated for low voltage, medium voltage or high-voltage. For example, medium-voltage AC motors, such as those used in industrial process control, may operate in the 4.16 kV to 13.8 kV range. Greater or lesser voltage may be used. More than one motor 320 may be connected. Other loads may be used instead of or in addition to the motor 320. The motor 320 responds to the voltage applied by the multilevel converter on the three phases, for example, to increase, decrease or maintain a speed or position.

Figure 4:
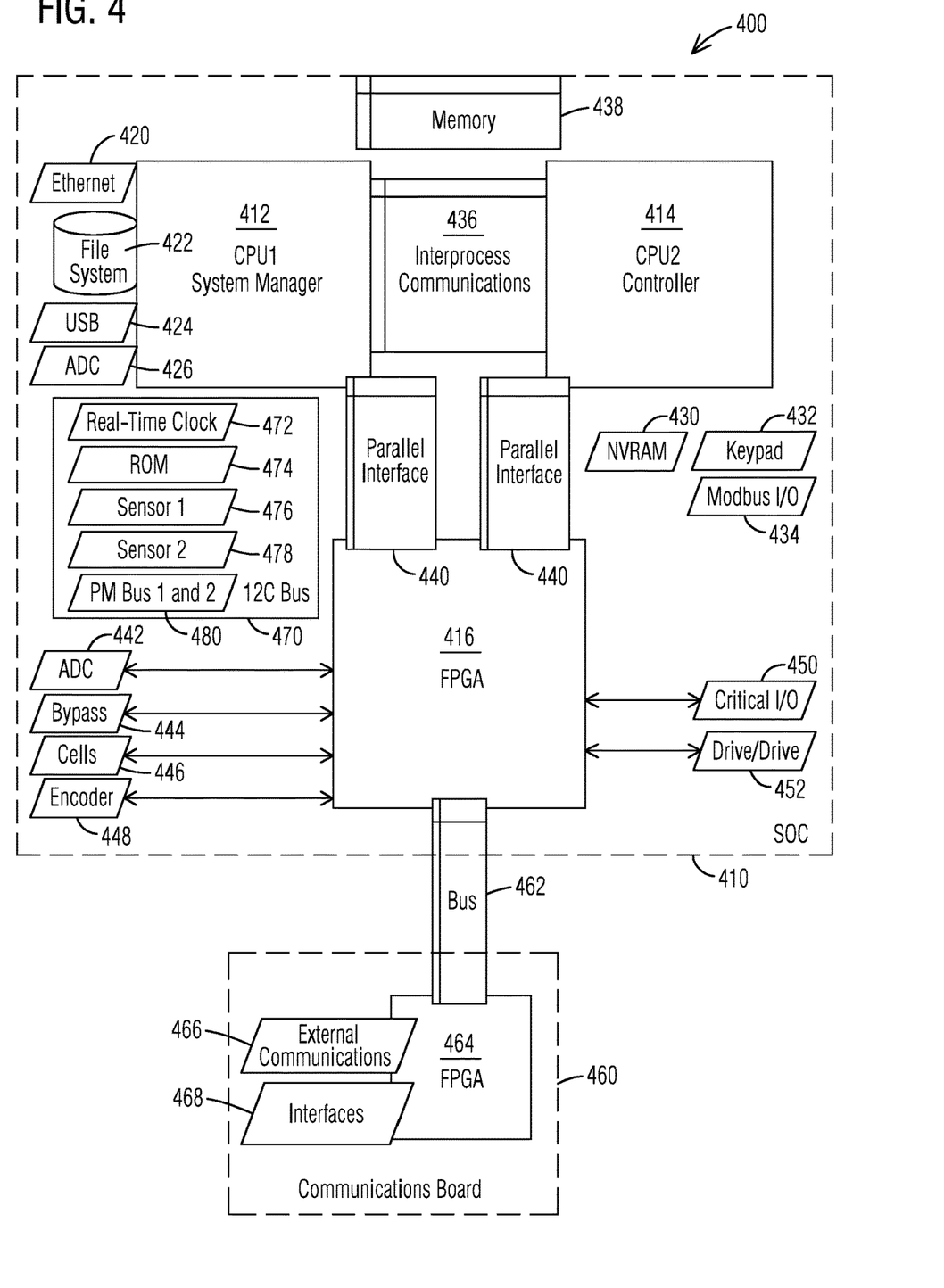
FIG. 4 illustrates a schematic diagram of an architecture of a control system of a drive system in accordance with an exemplary embodiment disclosed herein.

FIG. 4 illustrates a schematic diagram of an architecture of a control system 400 of a drive system in accordance with an exemplary embodiment disclosed herein. The control system 400 will be described with reference to the drive system 300 of FIG. 3. However, it should be noted that other types of drive systems can be utilized in connection with the control system 400, for example modular multilevel converter systems with M2C or M2LC subsystems.

In an example, the drive system 300 comprising control system 400 with SOC 410 can be embodied as medium voltage variable frequency drive comprising an output voltage between about 2.3 kV and about 11 kV.

As noted before, current control systems of drive systems divide control tasks, such as for example control loop command and status, power cell control information and external communications interface, into three separate components that require a dedicated data bus on a printed circuit board. Thus, an improved control system 400 is provided which will be described in detail with reference to FIG. 4.

In accordance with an exemplary embodiment, the control system 400 comprises a system on chip (SOC) 410 integrating main control components into a single integrated circuit instead of separate devices. A system on chip, also known as system on a chip, is an integrated circuit that integrates all or most components of a computer or other electronic system on a single substrate.

The SOC 410 comprises one or more central processing units (CPU) 412, 414 and a field programmable gate array (FPGA) 416 in communication with the one or more central processing units 412, 414. Specifically, the described embodiment provides a first central processing unit (CPU1) 412 and a second central processing unit (CPU2) 414, each performing different tasks. However, it should be noted that first and second processing units 412, 414 may combined into a single central processing unit.

The first central processing unit 412 may be referred to as 'system manager', wherein the second central processing unit 414 may be referred to as 'controller'. Each central processing unit 412, 414 comprises a microprocessor and other circuitry to perform control and processing tasks.

The first processing unit 412 (system manager) is configured to communicate with an ethernet interface 420, a file system interface 422, one or more USB interfaces 424, and an analog-to-digital interface 426. The respective interfaces may be considered 'non-drive' interfaces, and information provided by the interface may be considered 'non-drive' information or command and status information.

The second processing unit 414 (controller) is configured to receive power cell control information and to generate operating commands for the power cells 312. The second processing unit 414 together with the FPGA 416 controls operation of the power cells 312 and thus provides functionality to control the load, e. g., electric motor 320 of the drive system 300. The second processing unit 414 can be operably coupled to a memory 430, such as a non-volatile random access memory (NVRAM), a keypad 432, for example for entering parameters of the drive system, and a MODBUS I/O (input/output) module 434. Modbus is a serial communications protocol used for connecting industrial electronic devices.

The first and second central processing units 412, 414 communicate with each other via an inter-process communication link 436, and both processing units 412, 414 may be configured to communicate with memory 438, which can be a random access memory. The described components with respect to the first and second central processing units 412, 414 and the FPGA 416 are all contained on the SOC 410.

In accordance with a further embodiment, the SOC comprises a dedicated data bus 440, labelled as parallel interface, between the central processing unit(s) 412, 414 and the FPGA 416 for communication purposes.

FPGA 416 is configured to communicate with one or more analog-to-digital converters (ADC) 442, a power cell bypass system 444, a plurality of power cells 446 (such as for example power cells 312 of FIG. 3), an encoder 448, one or more input/output interfaces (critical I/O) 450, and an internal network (drive/drive) 452.

The one or more analog-to-digital converters 442 may be utilized to convert various analog signals (e.g., voltage amplitudes, current amplitudes, cell temperatures, etc.) to digital signals. The power cell bypass system 444 may be utilized to bypass one or more failed power cells of the drive system. Each power cell 446 sends operating information to the FPGA 416 and receives operational commands via the FPGA 416. The encoder 448 is associated with electric motor 320 of the system 300 and converts rotary motion or position of the motor 320 to a code of electronic pulses and communicates the electronic pulses to the FPGA 416. The one more input/output interfaces 450 may be embodied for example as switches, potentiometers etc. allowing an operator of the drive system to provide certain parameters. The internal network 452 may be utilized to facilitate an interconnection of multiple drive systems. The information provided by the devices 442, 444, 446, 448, 450, 452 may be considered 'drive' information which includes specific information related to power cell control.

In operation, the FPGA 416 performs logic operations on received drive information, and then passes resultant information to the second central processing unit (controller) 414. The second processing unit 414 processes the resultant information and, based on processed information, generates operational commands for the FPGA 416 to distribute to the appropriate interfaces, such as power cells 446 and encoder 448. Essentially, the FPGA 416 handles internal housekeeping and unique communications to the appropriate interfaces.

SOC 410 may comprise further components. Such components can include for example real-time clock 472, read-only memory (ROM) 474, one or more sensors 474, 476 such as for example temperature sensor, humidity sensor, or pressure sensor, and power management bus (PMBus) 480. The components 472, 474, 476, 478, 480 communicate via inter-integrated circuit (I2C).

In another exemplary embodiment, as illustrated in FIG. 4, the control system 400 further comprises a communications board 460 for external communications. The communications board 460 can be external to the SOC 410, wherein the SOC and the communications board 460 communicate via a data bus (BUS) 462. The communications board 460 may comprise a further field programmable gate array 464, the further field programmable gate array 464 configured to perform external communications 466 and to communicate with devices external to the SOC, such as interfaces 468 used for example to connect motor modules, terminal modules or sensor modules to the drive system.

However, by utilizing a SOC 410 and a FPGA 416 with a sufficiently large logic density, the external communications function (communications board 460) can also be incorporated in the SOC 410. In this case, FPGA 416 is further configured to communicate with devices or systems external to the SOC 410, such as for example an external network.

Further, the control system 400 further stores and executes specific instructions to implement pulse width modulation (PWM) control. By pulse-width modulating the voltage reference for each phase, the control system 400, specifically second processing unit 414, controls each of the power cells 446 (power cells 312 of FIG. 3), and thus, the amplitude and frequency of the voltage output between the output lines 316a, 316b of each power cell 312. A local control circuit or control board in the respective power cells 312 may receive the voltage reference and generate the gating pulses for power switching devices using appropriate vector controls and pulse-width modulation. Alternatively, the processing unit 414 may output the gating pulses for the cells 312 based on the voltage references.

Figure 5:
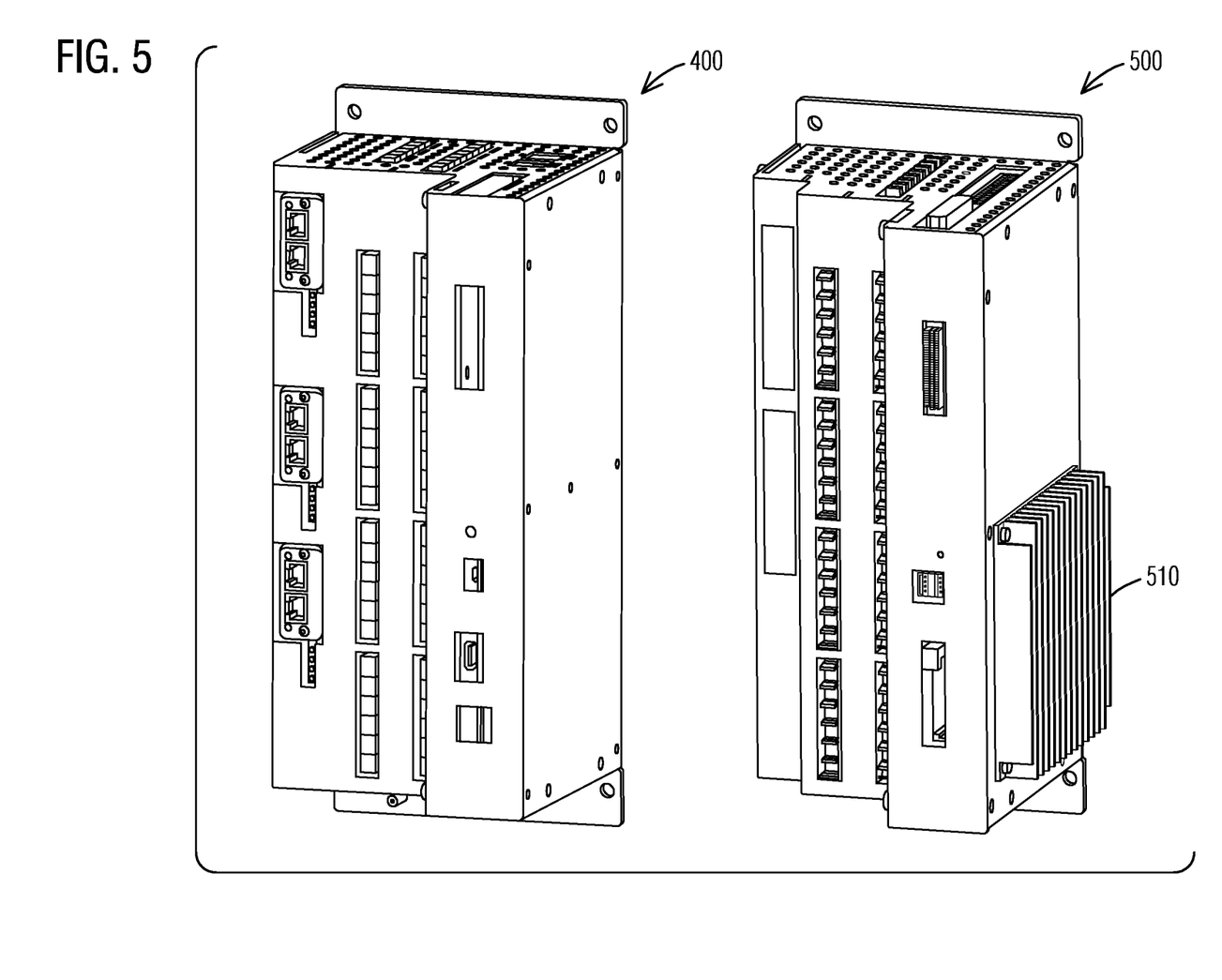
FIG. 5 illustrates perspective views of different control system devices in accordance with an exemplary embodiment disclosed herein.

FIG. 5 illustrates perspective views of different control system devices in accordance with an exemplary embodiment disclosed herein. Specifically, FIG. 5 illustrates improved control system 400 comprising SOC 410 in comparison with an existing control system 500. Control system 500 comprises for example heat sink 510 which is required for cooling purposes and transfers heat generated mainly by an internal central processing unit. Control system 400 does not require such a heat sink because it comprises SOC 410 including central processing unit(s) and many other components.

The SOC 410 including all its components is etched on a silicon wafer. By utilizing a SOC, a single device is used which contains one or more central processing units 412, 414 along with FPGA logic 416 as well as a dedicated data bus 440. Thus, the physical space for the control system 400 is reduced. Instead of three or four separate devices, only one device, the SOC 410, is required. Reduced size provides extra space to add electronic features to an existing form factor of the control system 400. With the data bus 440 internal to the SOC 410, no carefully engineered PCB data bus trace interconnect is required. Further, the number of parts is reduced which increases robustness of the control system 400 to failures.

The invention claimed is:

1. A drive system comprising:
a plurality of power cells supplying power to one or more output phases, each power cell comprising multiple switching devices incorporating semiconductor switches, and
a control system in communication with the plurality of power cells and controlling operation of the plurality of power cells,
wherein the control system comprises a system on chip comprising
one or more central processing units, and
a field programmable gate array in communication with the one or more central processing units,
wherein the system on chip comprises first and second central processing units in communication with each other,
wherein the second central processing unit is configured to receive power cell control information and to generate first operating commands, and
wherein the first central processing unit is configured to receive command and status information and to generate at least one instruction based upon the command and status information, the at least one instruction configured to instruct the second central processing unit to generate second operating commands.

2. The drive system of claim 1,
wherein the system on chip further comprises a dedicated data bus between the one or more central processing units and the field programmable gate array.

3. The drive system of claim 1,
wherein the field programmable gate array is in communication with the plurality of power cells and is configured to
receive the power cell control information from each of the plurality of power cells,
transmit the power cell control information to the second central processing unit, and
receive the first and second operating commands from the second central processing unit for distribution to the plurality of power cells.

4. The drive system of claim 1,
wherein the field programmable gate array is configured to distribute the first and/or second operating commands to at least one of an analog-to-digital converter, a power cell bypass system, a power cell, an encoder, an input-output interface, and an internal network.

5. The drive system of claim 1,
wherein the field programmable gate array is further configured to communicate with devices external to the system on chip.

6. The drive system of claim 1,
wherein one of the central processing units is configured to communicate with at least one of an Ethernet interface, a file system interface, a universal serial bus interface and an analog-to-digital converter interface.

7. The drive system of claim 1,
wherein one of the central processing units is operably coupled to a memory, a keypad and a MODBUS I/O module.

8. The drive system of claim 1,
wherein the system on chip further comprises a memory, the first and second central processing units configured to communicate with the memory.

9. The drive system of claim 1,
wherein the control system further comprises a communications board external to the system on chip, the system on chip and the communications board communicating via a further data bus.

10. The drive system of claim 9,
wherein the communications board comprises a further field programmable gate array configured to communicate with devices external to the system on chip.

11. The drive system of claim 1,
wherein the system on chip is etched on a silicon wafer.

12. The drive system of claim 1,
embodied as medium voltage variable frequency drive comprising an output voltage between about 2.3 kV and about 11 kV.

13. The drive system of claim 1,
further comprising a cascaded H-bridge converter system.

* * * * *